US012588452B2

(12) United States Patent
Choi et al.

(10) Patent No.: US 12,588,452 B2
(45) Date of Patent: Mar. 24, 2026

(54) SUBSTRATE PROCESSING APPARATUS AND METHOD THEREOF

(71) Applicant: SAMSUNG ELECTRONICS CO., LTD., Suwon-si (KR)

(72) Inventors: Hae Won Choi, Daejeon (KR); Seung Min Shin, Suwon-si (KR); Sang Jine Park, Suwon-si (KR); Jae Won Shin, Suwon-si (KR); Ji Hwan Park, Hwaseong-si (KR); Kun Tack Lee, Suwon-si (KR); Koriakin Anton, Cheonan-si (KR); Joon Ho Won, Suwon-si (KR); Pil Kyun Heo, Yongin-si (KR)

(73) Assignees: SAMSUNG ELECTRONICS CO., LTD., Suwon-si (KR); SEMES CO., LTD., Cheonan-si (KR)

( * ) Notice: Subject to any disclaimer, the term of this patent is extended or adjusted under 35 U.S.C. 154(b) by 909 days.

(21) Appl. No.: 17/876,266

(22) Filed: Jul. 28, 2022

(65) Prior Publication Data

US 2023/0131222 A1 Apr. 27, 2023

(30) Foreign Application Priority Data

Oct. 26, 2021 (KR) ........................ 10-2021-0143465

(51) Int. Cl.
| | |
|---|---|
| *H01L 21/02* | (2006.01) |
| *B08B 9/08* | (2006.01) |
| *H01L 21/67* | (2006.01) |

(52) U.S. Cl.
CPC .. *H01L 21/67034* (2013.01); *H01L 21/02052* (2013.01); *H01L 21/67248* (2013.01); *H01L 21/67253* (2013.01)

(58) Field of Classification Search
CPC ......... H01L 21/67034; H01L 21/02052; H01L 21/67253; H01L 21/02046; B08B 9/08
(Continued)

(56) References Cited

U.S. PATENT DOCUMENTS

| | | | |
|---|---|---|---|
| 6,905,555 B2 | 6/2005 | DeYoung et al. | |
| 8,465,596 B2 * | 6/2013 | Toshima ........... | H01L 21/67017 216/2 |

(Continued)

FOREIGN PATENT DOCUMENTS

| | | | | |
|---|---|---|---|---|
| CN | 109116688 A | * | 1/2019 | ............. G03F 7/038 |
| KR | 20120056620 A | * | 6/2016 | ....... H01L 21/67034 |

(Continued)

OTHER PUBLICATIONS

CN109116688 by PE2E May 4, 2025.*
KR 20120056620 by PE2E May 4, 2025.*

*Primary Examiner* — Deming Wan
(74) *Attorney, Agent, or Firm* — Sughrue Mion, PLLC

(57) ABSTRACT

A substrate processing apparatus and a substrate processing method are provided, in which a flow rate of $CO_2$ injected into a supercritical drying vessel is controlled through multi-level pressure control. The substrate processing method includes disposing a substrate coated with a chemical liquid in a process chamber, that includes a space in which the substrate is processed; drying the substrate by using a supercritical fluid; and taking the substrate out of the process chamber when the substrate is dried.

20 Claims, 14 Drawing Sheets

(58) Field of Classification Search
USPC .................................................. 34/402, 405
See application file for complete search history.

(56) References Cited

U.S. PATENT DOCUMENTS

| | | | |
|---|---|---|---|
| 10,852,698 B2 | 12/2020 | Tseng | |
| 2020/0047224 A1* | 2/2020 | Fukui | ................ H01L 21/67017 |

FOREIGN PATENT DOCUMENTS

| | | | |
|---|---|---|---|
| KR | 10-2016-0135035 A | 11/2016 | |
| KR | 10-2017-0006570 A | 1/2017 | |
| KR | 10-2018-0064985 A | 6/2018 | |

* cited by examiner

<u>300</u>

SUBSTRATE PROCESSING APPARATUS AND METHOD THEREOF

CROSS-REFERENCE TO RELATED APPLICATION

This application claims priority from Korean Patent Application No. 10-2021-0143465 filed on Oct. 26, 2021, in the Korean Intellectual Property Office and all the benefits accruing therefrom under 35 U.S.C. 119, the disclosure of which is incorporated herein in its entirety by reference.

BACKGROUND

1. Field

Embodiments of the present disclosure relate to a substrate processing apparatus and method, and more particularly, to an apparatus and method for drying and processing a substrate.

2. Description of the Related Art

When a developing solution coated on a wafer is dried, the wafer may be placed on a spin head and the spin head may be rotated to dry the developing solution on the wafer. However, this method may cause problems such as photo resist (PR) collapse, leaning, bridge, and lifting.

Recently, in order to address the above problems, a method of substituting and drying a developing solution on a wafer by using supercritical $CO_2$ has been utilized. In this case, a high-pressure $CO_2$ supply device system may be used, and a $CO_2$ supply device system of the related art and its control method cause a local annular shape, a clustered cluster defect, and the like, which are generated due to a wafer drying defect.

SUMMARY

According to an aspect of the present disclosure, a substrate processing apparatus and method is provided, in which a flow rate of $CO_2$ injected into a supercritical drying vessel is controlled through multi-level pressure control.

Aspects of the present disclosure are not limited to those mentioned above and additional aspects of the present disclosure, which are not mentioned herein, will be clearly understood by those skilled in the art from the following description of the present disclosure.

According to embodiments of the present disclosure, a substrate processing method is provided. The substrate processing method includes: supplying a fluid into a process chamber to pressurize the fluid to be in a supercritical phase in the process chamber; processing a substrate in the process chamber by using the fluid in the supercritical phase; and reducing a pressure in the process chamber by exhausting the fluid from the process chamber. During the first time period: the supplying includes providing, by a fluid supply unit that includes at least one valve, a first initial supply amount of the fluid toward the process chamber, and the supplying further includes discharging, by a venting unit that includes at least one valve, a first discharge amount of the fluid so that a first supply amount of the fluid is supplied into the process chamber. During the second time period: the supplying includes providing, by the fluid supply unit, a second initial supply amount of the fluid, different from the first initial supply amount, toward the process chamber, and the supplying further includes discharging, by the venting unit, a second discharge amount different from the first discharge amount so that a second supply amount of the fluid, different from the first supply amount, is supplied into the process chamber.

According to embodiments of the present disclosure, a substrate processing apparatus is provided. The substrate processing apparatus includes: a process chamber in which supercritical drying of a substrate is configured to be performed; a fluid supply unit comprising at least one valve, the fluid supply unit configured to supply a fluid used for the supercritical drying as a part of a pressurizing step; a venting unit comprising at least one valve, the venting unit configured to adjust a supply amount of the fluid as a part of the pressurizing step; at least one processor; and a memory storing computer instructions, the computer instructions configured to, when executed by the at least one processor, cause the at least one processor to control the fluid supply unit and the venting unit to perform the pressurizing step. The pressuring step is performed in a first time period and a second time period, which are continuous with each other. During the first time period: the fluid supply unit is controlled by the at least one processor to provide a first initial supply amount of the fluid toward the process chamber, and the venting unit is controlled by the at least one processor to discharge a first discharge amount of the fluid so that a first supply amount of the fluid is supplied into the process chamber. During the second time period: the fluid supply unit is controlled by the at least one processor to provide a second initial supply amount of the fluid, different from the first initial supply amount, toward the process chamber, and the venting unit is controlled by the at least one processor to discharge a second discharge amount of the fluid, different from the first discharge amount, so that a second supply amount of the fluid, different from the first supply amount, is supplied into the process chamber.

According to embodiments of the present disclosure, a substrate processing apparatus is provided. The substrate processing apparatus includes: a process chamber in which supercritical drying of a substrate is configured to be performed; a fluid supply unit configured to supply a fluid used for the supercritical drying as a part of a pressurizing step; a venting unit configured to adjust a supply amount of the fluid as a part of the pressurizing step; at least one processor; and a memory storing computer instructions, the computer instructions configured to, when executed by the at least one processor, cause the at least one processor to control the fluid supply unit and the venting unit to perform the pressurizing step. The pressuring step is performed in a first time period and a second time period, which are continuous with each other. The computer instructions are configured to cause the at least one processor to, during the first time period, control the fluid supply unit and the venting unit such that a first supply amount of the fluid is supplied into the process chamber. The computer instructions are configured to cause the at least one processor to, during the second time period, control the fluid supply unit and the venting unit such that a second supply amount of the fluid, greater than the first supply amount, is supplied into the process chamber. A slope of pressure rise in the process chamber during the second time period is greater than a slope of pressure rise in the process chamber during the first time period. The fluid supply unit includes: a storage tank configured to store the fluid; a main supply line connected to the process chamber; and a first supply line and a second supply line, which are disposed in parallel between the storage tank and the main supply line. The venting unit includes: a first venting line and a second venting line, which are disposed in parallel with the main supply line.

Specific details of other embodiments are included in the following detailed descriptions and in the drawings.

BRIEF DESCRIPTION OF DRAWINGS

The above and other aspects and features of the present disclosure will become more apparent by describing in detail non-limiting examples embodiments thereof with reference to the attached drawings, in which.

DETAILED DESCRIPTION

Figure 1:
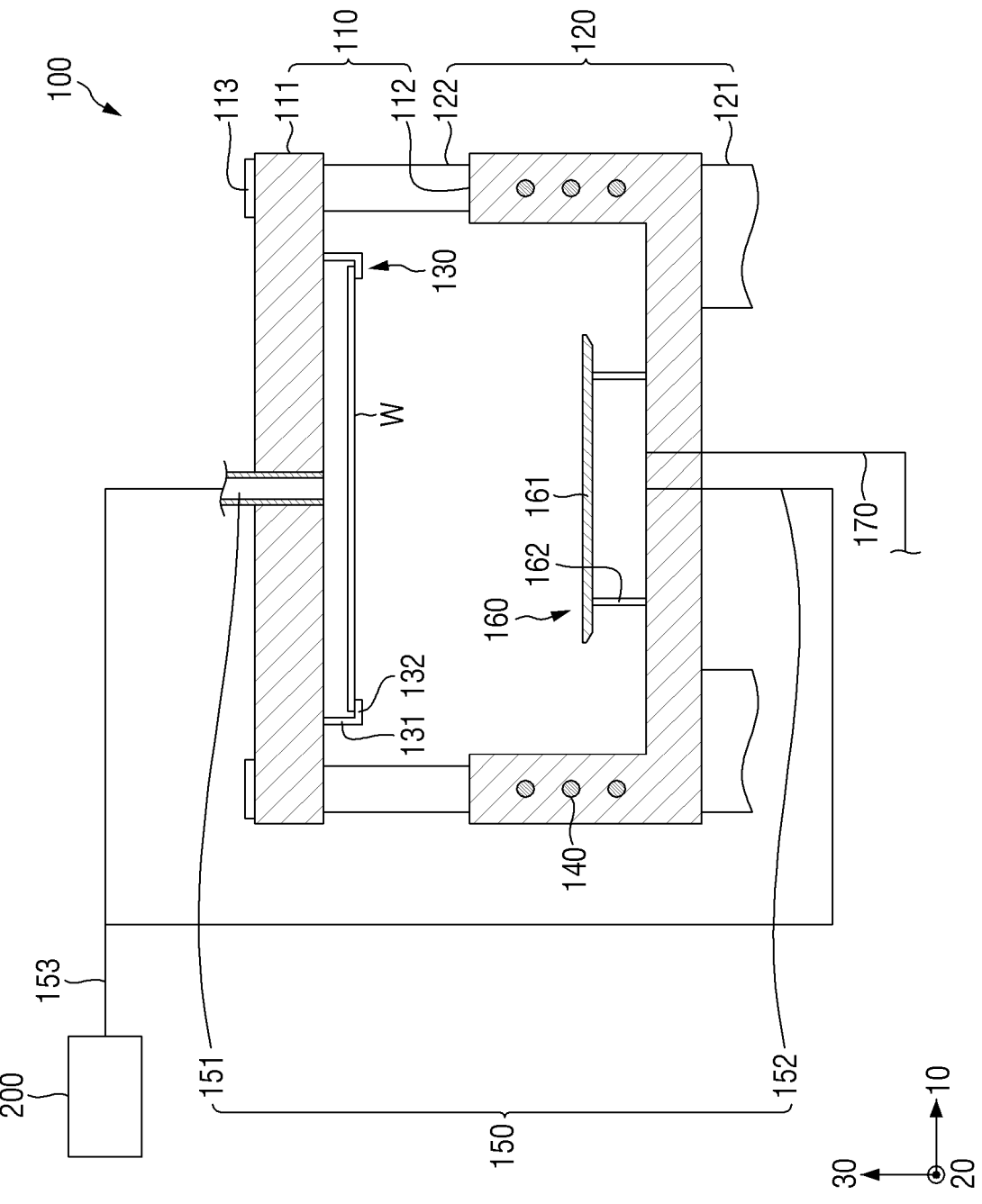
FIG. 1 is an example view illustrating an internal structure of a process chamber constituting a substrate processing apparatus according to one embodiment of the present disclosure.

Hereinafter, embodiments of the present disclosure will be described in detail referring to the accompanying drawings. These embodiments are example embodiments, and thus, the present disclosure is not limited thereto and may be realized in various other forms. The same constituent elements in the drawings are denoted by the same reference numerals, and repeated descriptions thereof will be omitted.

When a developing solution coated on a wafer is dried using spin, problems such as photo resist (PR) collapse, leaning, bridge, lifting, etc. may occur. In order to address the problems, a system for supplying $CO_2$ at a simple level may be used. In case of the system, problems such as a local annular shape, a clustered cluster defect, etc. may be caused due to a drying defect of the wafer.

In detail, the system controls an internal pressure of a pipe based on a reservoir set input value in a single step level method. In this case, since there is a difficulty in controlling an initial boosting speed, the developing solution may be dried in the wafer locally and rapidly, resulting in a problem in which a clustered cluster is generated.

An aspect of the present disclosure is based on the development of a supercritical developer for preventing a photo resist (PR) pattern from being collapsed in a photo process. Embodiments of the present disclosure are characterized in that the developing solution is substituted/dried using supercritical $CO_2$, and is intended to address the corresponding problems by applying a multi-step level control system and a supply vent control to control a pressure in a supply pipe and a vessel type process chamber.

More specifically, a substrate processing apparatus and a substrate processing method are disclosed, in which a flow rate of $CO_2$ injected into a supercritical drying vessel is controlled through multi-level pressure control. The substrate processing method my include: disposing a substrate coated with a chemical liquid in a process chamber that provides a space in which the substrate is processed; drying the substrate by using a supercritical fluid; and taking the substrate out of the process chamber when the substrate is dried. Here, the drying step may include adjusting the amount of the supercritical fluid in the process chamber by controlling a plurality of pressure control valves installed on a first pipe, for connecting a supercritical fluid reservoir with a front end of the process chamber, and a second exhaust control valve installed on a second pipe connected with a rear end of the process chamber. For example, some of the plurality of pressure control valves are initially opened to provide the supercritical fluid into the process chamber, and then the supercritical fluid is provided into the process chamber by increasing the number of valves opened whenever a certain time passes until an internal pressure of the process chamber reaches the highest pressure. As an alternative to increasing the number of valves opened, a pressure control valve may be selectively opened for providing a flow rate greater than a previous flow rate, and a closing and opening operation of the exhaust control valve is repeated to adjust the amount of the supercritical fluid in the process chamber after the internal pressure of the process chamber reaches the highest pressure.

First of all, the process chamber (i.e., vessel) constituting a substrate processing apparatus will be described. FIG. 1 is an example view illustrating an internal structure of a process chamber constituting a substrate processing apparatus according to one embodiment of the present disclosure.

Referring to FIG. 1, the process chamber 100 may include a housing 110, a lifting unit 120, a support unit 130, a heating member 140, a fluid supply unit 150, a blocking member 160, and an exhaust member 170.

The process chamber 100 may process the substrate by using a supercritical fluid. The process chamber 100 may utilize, for example, carbon dioxide ($CO_2$) as a supercritical fluid, and may supercritical-dry the substrate by using $CO_2$ of a critical temperature of 31° C. and a critical pressure of 73.8 bar or more.

The housing 110 provides a processing space in which a supercritical drying process is performed. The housing 110 may be provided as a material capable of withstanding a high pressure of a critical pressure or more.

The housing 110 includes an upper module 111 and a lower module 112. The lower module 112 is provided to be coupled to the upper module 111 below the upper module 111. A space generated by combination of the upper module 111 and the lower module 112 is provided as a processing space for performing a substrate processing process.

The upper module 111 is provided to be fixed to an external structure. The lower module 112 is provided to be lifted up and down with respect to the upper module 111. When the lower module 112 descends to be spaced apart from the upper module 111, the processing space is opened in the process chamber 100. In the opened processing space, a substrate W may be loaded into an internal space of the process chamber 100 or may be taken out of the internal space.

The substrate W loaded into the process chamber 100 may be in a state in which a substrate cleaning solution (e.g., Iso-Propyl Alcohol (IPA)) remains. When the lower module 112 ascends to be in close contact with the upper module 111, the processing space is sealed inside the process chamber 100. The substrate W may be processed in the sealed processing space by a supercritical fluid. Unlike the above-described example, the lower module 112 may be fixedly installed in the housing 110, and the upper module 111 may be provided to be lifted up and down.

The lifting unit 120 lifts the lower module 112 up and down. The lifting unit 120 includes a lifting cylinder 121 and a lifting rod 122. The lifting cylinder 121 is coupled to the lower module 112 to generate a vertical driving force. The lifting cylinder 121 may be configured to withstand a high pressure above a critical pressure inside the process chamber 100 while the substrate processing using the supercritical fluid is being performed, and generates a driving force to seal the process chamber 100 by closely adhering the upper module 111 with the lower module 112. One end of the lifting rod 122 is inserted into the lifting cylinder 121 and extended in a vertical direction (third direction 30) and thus the other end thereof is coupled to the upper module 111.

When a driving force is generated in the lifting cylinder 121, the lifting cylinder 121 and the lifting rod 122 are lifted up and down relative to each other, whereby the lower module 112 coupled to the lifting cylinder 121 may be lifted up and down. While the lower module 112 is being lifted by the lifting cylinder 121, the lifting rod 122 may prevent the upper module 111 and the lower module 112 from being detached from their positions by preventing the upper module 111 and the lower module 112 from moving in a horizontal direction (the first direction 10 or the second direction 20) and may guide the lifting direction.

The support unit 130 is positioned in the processing space of the housing 110 and supports the substrate W. The support unit 130 is coupled to the upper module 111. The support unit 130 includes a vertical portion 131 and a horizontal portion 132.

The vertical portion 131 is provided to be downwardly extended from an upper wall of the housing 110. The vertical portion 131 is installed on a lower surface of the upper module 111. The vertical portion 131 is provided to be extended toward a lower portion of the upper module 111.

An end of the vertical portion 131 is vertically coupled to the horizontal portion 132. The horizontal portion 132 is provided to be extended from the end of the vertical portion 131 to the inside of the housing 110. The substrate W is placed on the horizontal portion 132. The horizontal portion 132 supports a bottom surface of an edge area of the substrate W.

The support unit 130 may support the substrate W in contact with the edge area of the substrate W to perform substrate processing by the supercritical fluid for an entire area of the upper surface of the substrate W and most of the lower surface of the substrate W. In this case, the upper surface of the substrate W may be a pattern surface, and the lower surface of the substrate W may be a non-pattern surface.

The support unit 130 is installed in the upper module 111. The support unit 130 may support the substrate W relatively stably while the lower module 112 is being lifted.

A horizontal adjustment member 113 is installed in the upper module 111 on which the support unit 130 is installed. The horizontal adjustment member 113 adjusts the horizontality of the upper module 111. The horizontality of the upper module 111 is adjusted to adjust the horizontality of the substrate W seated on the support unit 130 installed in the upper module 111. When the upper module 111 is lifted and the lower module 112 is fixed or the support unit 130 is installed in the lower module 112, the horizontal adjustment member 113 may be installed even in the lower module 112.

The heating member 140 heats the inside of the process chamber 100. The heating member 140 heats the supercritical fluid supplied into the process chamber 100 at a critical temperature or more to maintain a supercritical fluid phase. When the supercritical fluid is liquefied, the heating member 140 may heat the supercritical fluid to allow the liquefied supercritical fluid to be the supercritical fluid again. The heating member 140 is embedded in a wall of at least one from among the upper module 111 and the lower module 112. The heating member 140 generates heat by receiving a power source (e.g., electricity) from the outside. The heating member 140 may be provided, for example, as a heater.

The fluid supply unit 150 supplies a fluid to the process chamber 100. The supplied fluid may be a supercritical fluid. As an example, the supercritical fluid that is supplied may be carbon dioxide ($CO_2$).

The fluid supply unit 150 includes an upper fluid supply 151, a lower fluid supply 152, and a supply pipe 153.

The upper fluid supply 151 directly supplies the supercritical fluid to the upper surface of the substrate W. The upper fluid supply 151 is provided to be connected to the upper module 111. The upper fluid supply 151 is provided to be connected to the upper module 111 facing a central upper surface of the substrate W.

The lower fluid supply 152 supplies the supercritical fluid to the lower surface of the substrate W. The lower fluid supply 152 is provided to be connected to the lower module 112. The lower fluid supply 152 is provided to be connected to the lower module 112 facing a central lower surface of the substrate W.

The supercritical fluid sprayed from the upper fluid supply 151 and the lower fluid supply 152 reaches the central area of the substrate W and is spread to the edge area to be uniformly provided to the entire area of the substrate W.

The supply pipe 153 is connected with the upper fluid supply 151 and the lower fluid supply 152. The supply pipe 153 receives the supercritical fluid from a supercritical fluid reservoir 200 separately provided outside the supply pipe 153 and supplies the supercritical fluid to the upper fluid supply 151 and the lower fluid supply 152.

The fluid supply unit 150 may first supply the supercritical fluid via the lower fluid supply 152. Then, the upper fluid supply 151 may supply the supercritical fluid. The supercritical drying process may be performed in a state that the inside of the process chamber 100 does not reaches a critical pressure. When the inside of the process chamber 100 does not reach the critical pressure, the supercritical fluid supplied to the inside the process chamber 100 may be liquefied. When the supercritical fluid is liquefied, the liquefied supercritical fluid, if dropped on the substrate W by gravity, could damage the substrate W.

Therefore, the lower fluid supply 152 first supplies the supercritical fluid. After the supercritical fluid is supplied to the process chamber 100, the internal pressure reaches the critical pressure. After the internal pressure of the process chamber 100 reaches the critical pressure, the upper fluid supply 151 supplies the supercritical fluid. The lower fluid supply 152 may supply the supercritical fluid earlier than the upper fluid supply 151 to prevent the supercritical fluid from being liquefied and then dropped onto the substrate W.

The blocking member 160 prevents the supercritical fluid supplied from the fluid supply unit 150 from being directly sprayed to the lower surface of the substrate W. The blocking member 160 includes a blocking plate 161 and a support 162.

The blocking plate 161 is positioned inside the housing 110, i.e., in the processing space. The blocking plate 161 is disposed between the support unit 130 and the lower fluid supply 152. The blocking plate 161 is provided in a shape corresponding to the substrate W. For example, the blocking plate 161 may be provided in a circular plate shape. A radius of the blocking plate 161 may be similar to or larger than the substrate W. The blocking plate 161 is positioned on the lower surface of the substrate W placed on the support unit 130 to prevent the supercritical fluid supplied through the lower fluid supply 152 from being directly sprayed to the lower surface of the substrate W. When the radius of the blocking plate 161 is similar to or greater than the substrate W, the supercritical fluid may completely be prevented from being directly sprayed to the substrate W.

On the other hand, the blocking plate 161 may have a diameter smaller than the substrate W. In this case, the supercritical fluid is prevented from being directly sprayed to the substrate W. In addition, a flow rate of the supercritical fluid is reduced to a minimum range, so that the supercritical fluid may reach the substrate W relatively easily. When the radius of the blocking plate 161 is smaller than the substrate W, a supercritical drying process may effectively be performed for the substrate W.

The support 162 supports the blocking plate 161. The support 162 supports a rear surface of the blocking plate 161. The support 162 is installed on a lower wall of the housing 110 and provided in a vertical direction (third direction 30). The blocking plate 161 may be installed on the support 162 by weight of the blocking plate 161 without a separate coupling.

On the other hand, the support 162 and the blocking plate 161 may be coupled to each other by coupling means such as nuts or bolts. Alternatively, the support 162 and the blocking plate 161 may be provided integrally.

The exhaust member 170 exhausts the supercritical fluid from the process chamber 100. The exhaust member 170 may be connected to an exhaust line that exhausts the supercritical fluid. Although not shown in FIG. 1, the exhaust member 170 may be provided with a valve for adjusting the flow rate of the supercritical fluid exhausted to the exhaust line.

The supercritical fluid exhausted through the exhaust line may be released to the atmosphere. Alternatively or additionally, the supercritical fluid may be supplied to a supercritical fluid regeneration system. The exhaust member 170 may be coupled to the lower module 112.

The supercritical fluid may be exhausted from the process chamber 100 at a later stage of the substrate processing process such that the internal pressure of the process chamber 100 may be decompressed to a critical pressure or less, whereby the supercritical fluid may be liquefied. The liquefied supercritical fluid may be discharged by gravity through the exhaust member 170 formed in the lower module 112.

With reference to the above descriptions, equipment may use a supply method through a single flow control system, and a set input value of a reservoir affects an initial boosting speed and then a boosting speed is controlled by one flow rate control system. Although such equipment is simple, it fails to variably control the initial boosting speed, and it is difficult to constantly maintain a start pressure by a single reservoir according to a driving time of the equipment due to a closed pipe.

Therefore, when a process is performed in the equipment, a drying defect is caused due to a limitation of the single flow rate control system, defects such as particles, drying residues, clustered clusters, etc. are generated on the wafer continuously, and a problem occurs in that homeostasis is deteriorated.

In addition, since the boosting speed is determined by the set pressure of the reservoir in a comparative supply apparatus, it is impossible to adjust the boosting speed until the inside of a process chamber reaches a predetermined pressure. Although the flow rate control system may control the initial boosting speed by increasing the time of arrival when the inside of the process chamber reaches the predetermined pressure, since a pressure is boosted log functionally by the comparative supply apparatus, it is difficult to lower the pressure to a desired pressure range. In addition, since the direction in which the time of arrival is increased through the comparative valve control results in serious degradation of productivity, an improved apparatus is required.

Embodiments of the present disclosure are characterized in that, when a supercritical fluid is supplied to the upper surface of a substrate W (e.g., wafer) in the process chamber 100, the supercritical fluid is initially supplied at a low pressure/low flow rate (e.g., 5 bar or less in initial 20 seconds) so as not to damage a surface of the substrate W due to a direct hit of the supercritical fluid, and then is continuously injected at a predetermined boosting speed through pressure control for each step.

In addition, embodiments of the present disclosure are characterized in that the developing solution on the surface of the substrate W is dried to be uniformly pushed from the center to the edge (Center-to-Edge) by $CO_2$ injected at a predetermined increment, thereby controlling the surface of the substrate W so as not to generate a clustered cluster defect.

Figure 2:
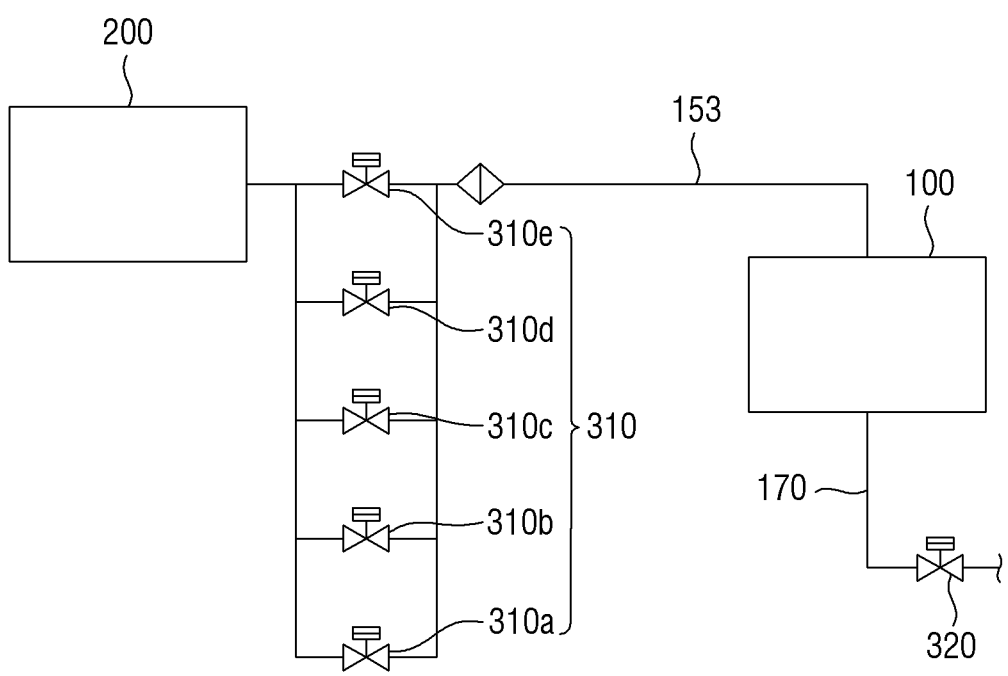
FIG. 2 is a first example view schematically illustrating an internal structure of a substrate processing apparatus according to one embodiment of the present disclosure.

Hereinafter, a substrate processing apparatus according to an embodiment of the present disclosure will be described in detail. FIG. 2 is a first example view schematically illustrating an internal structure of a substrate processing apparatus according to one embodiment of the present disclosure.

Referring to FIG. 2, the substrate processing apparatus 300 may include a supercritical fluid reservoir 200, a pressure control valve 310, a process chamber 100 and a second exhaust control valve 320.

The substrate processing apparatus 300 is for drying a chemical liquid (e.g., developing solution) coated on the substrate W. The substrate processing apparatus 300 may dry the chemical liquid coated on the substrate W by using the supercritical fluid (e.g., supercritical $CO_2$).

For example, a photosensitive film may be formed on the substrate W, and the substrate W may be inserted into the process chamber 100 while in a wet state with the developing solution.

A structure (i.e., the supercritical fluid reservoir 200, the pressure control valve 310, and the supply pipe 153) for supplying the supercritical fluid and a structure (i.e., the second exhaust control valve 320 and the exhaust member 170) for exhausting the supercritical fluid may be connected to the process chamber 100 to dry the chemical liquid on the substrate W. In detail, the structure for supplying the supercritical fluid may be connected to the upper fluid supply 151 (refer to FIG. 1) of the process chamber 100, and the structure for exhausting the supercritical fluid may be connected to the lower fluid supply 152 (refer to FIG. 1) of the process chamber 100.

The supercritical fluid reservoir 200 may be configured to store the supercritical fluid. The supercritical fluid reservoir 200 may store, for example, $CO_2$ as the supercritical fluid.

The pressure control valve 310 may be configured to be opened and closed for controlling the pressure in the process chamber 100. The pressure control valve 310 may be installed on the supply pipe 153 (i.e., main supply line) for connecting the supercritical fluid reservoir 200 (i.e., storage tank) with the process chamber 100.

A plurality of supply lines are installed between the supercritical fluid reservoir 200 and the supply pipe 153. A plurality of valves may be provided as the pressure control valve 310. In this case, the plurality of pressure control valves may be connected in parallel. That is, the pressure control valves may be installed in the plurality of supply lines, respectively. As shown in FIG. 2, five pressure control valves (e.g., a first pressure control valve 310a, a second pressure control valve 310b, a third pressure control valve 310c, a fourth pressure control valve 310d, and a fifth pressure control valve 310e) are installed as the pressure control valve 310. In this embodiment, the pressure control valve 310 may be installed as two to four, or six or more pressure control valves. On the other hand, the pressure control valve 310 may be provided as a single piece.

The pressure control valve 310 may open and close the supply pipe 153 to allow the supercritical fluid to be initially provided to the process chamber 100 at a low rate/low pressure. Then, the pressure control valve 310 may allow the supercritical fluid to be provided to the process chamber 100 at a predetermined increment as time passes. When the pressure control valve 310 is operated as described above, it is possible to obtain an effect of preventing the surface of the substrate W from being damaged by a direct hit of the supercritical fluid.

When a plurality of the pressure control valve 310 is installed, some of the plurality of valves may only be opened to provide the supercritical fluid at an initial low flow rate/low pressure, and then the number of the valves that are opened may be increased as time passes, whereby the supercritical fluid may be provided at a predetermined increment.

In addition, when the pressure control valve 310 is provided as a single piece, a portion of the single piece may be opened to provide the supercritical fluid at an initial low flow rate/low pressure. Afterwards, the open area of the single piece may be extended as the time passes, whereby the supercritical fluid may be provided at a predetermined increment. In this case, the pressure control valve 310 may be provided as a mass flow controller (MFC) capable of finely controlling the opening degree of the valve.

Hereinafter, a case that five pressure control valves (e.g. the first pressure control valve 310a, the second pressure control valve 310b, the third pressure control valve 310c, the fourth pressure control valve 310d and the fifth pressure control valve 310e) are provided as the pressure control valve 310 as shown in FIG. 2 will be described by way of example.

The first pressure control valve 310a, the second pressure control valve 310b, and the third pressure control valve 310c from among the five pressure control valves may be used to control a relatively low pressure, and the fourth pressure control valve 310d and the fifth pressure control valve 310e may be used to control a relatively high pressure.

Although a greater number of the valves are used to control the low pressure in the above example, embodiments of the present disclosure are not limited thereto. A greater number of the valves may be used to control the high pressure, or the same number of valves may be used to control the high pressure and the low pressure.

The first pressure control valve 310a, the second pressure control valve 310b, the third pressure control valve 310c, the fourth pressure control valve 310d, and the fifth pressure control valve 310e may be different from one another in magnitudes of pressures that may be controlled. For example, the second pressure control valve 310b may control a greater pressure than the first pressure control valve 310a, the third pressure control valve 310c may control a greater pressure than the second pressure control valve 310b, the fourth pressure control valve 310d may control a greater pressure than the third pressure control valve 310c, and the fifth pressure control valve 310e may control a greater pressure than the fourth pressure control valve 310d. That is, the fifth pressure control valve 310e, the fourth pressure control valve 310d, the third pressure control valve 310c, the second pressure control valve 310b and the first pressure control valve 310a may control relatively greater to lesser pressure in such order.

However, embodiments of the present disclosure are not limited to the above example. The first pressure control valve 310a, the second pressure control valve 310b, the third pressure control valve 310c, the fourth pressure control valve 310d and the fifth pressure control valve 310e may be the same as one another in magnitudes of pressures that may be controlled.

Meanwhile, although both a plurality of valves for controlling the low pressure and a plurality of valves for controlling the high pressure may be provided as above, the valve for controlling the low pressure may only be provided as a single piece. In this case, the valve for controlling the low pressure may be provided as the MFC described above.

Since the process chamber 100 has been already described with reference to FIG. 1, its detailed description will be omitted.

The second exhaust control valve 320 may be configured to discharge the fluid in the process chamber 100 to the outside. The second exhaust control valve 320 may be installed on the exhaust member 170 connected to the process chamber 100. The second exhaust control valve 320 may be provided on the exhaust member 170 as a single piece, but a plurality of the second exhaust control valve 320 may be provided on the exhaust member 170.

Figure 3:
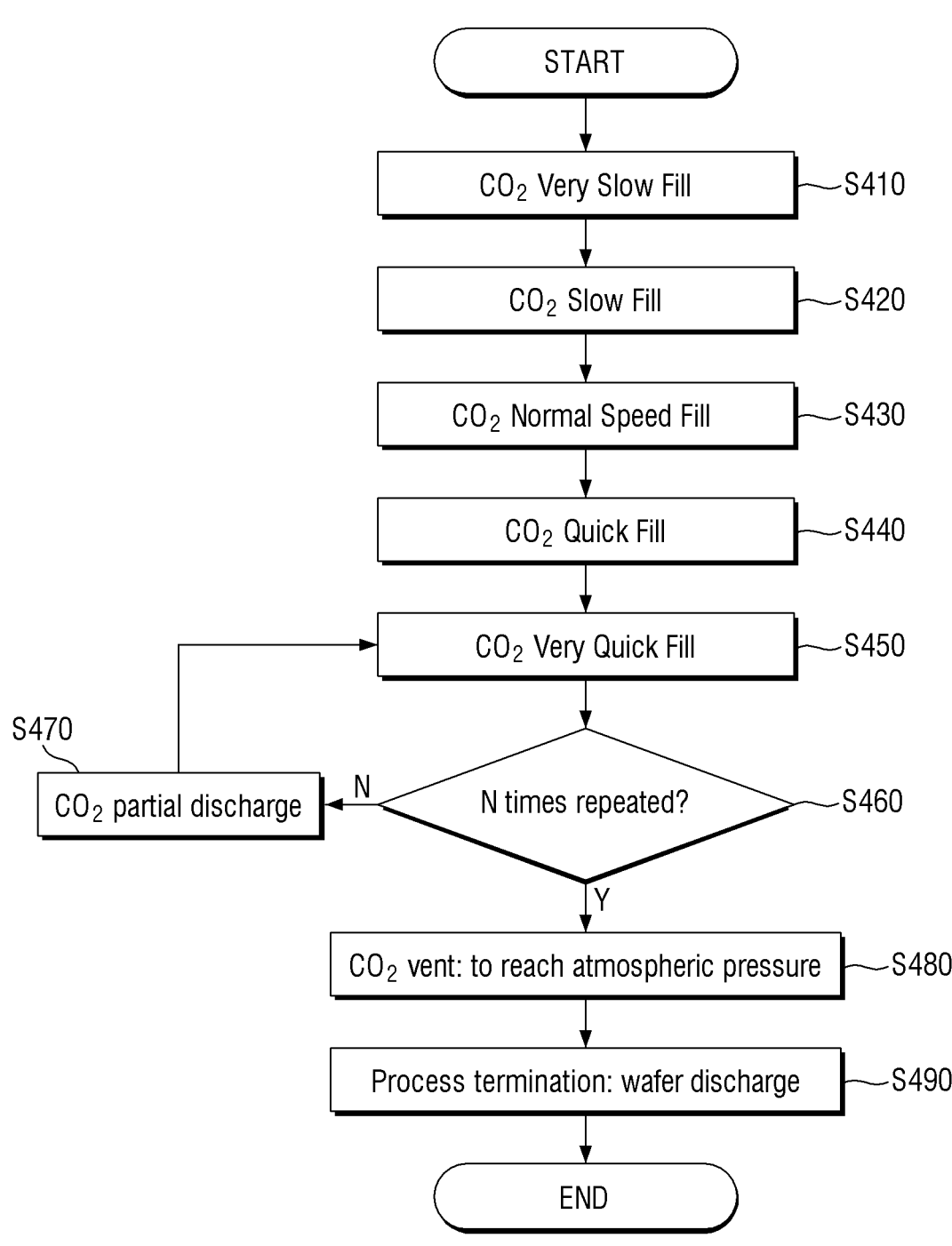
FIG. 3 is a flow chart illustrating a substrate processing method using a supercritical fluid according to one embodiment of the present disclosure.
Figure 4:
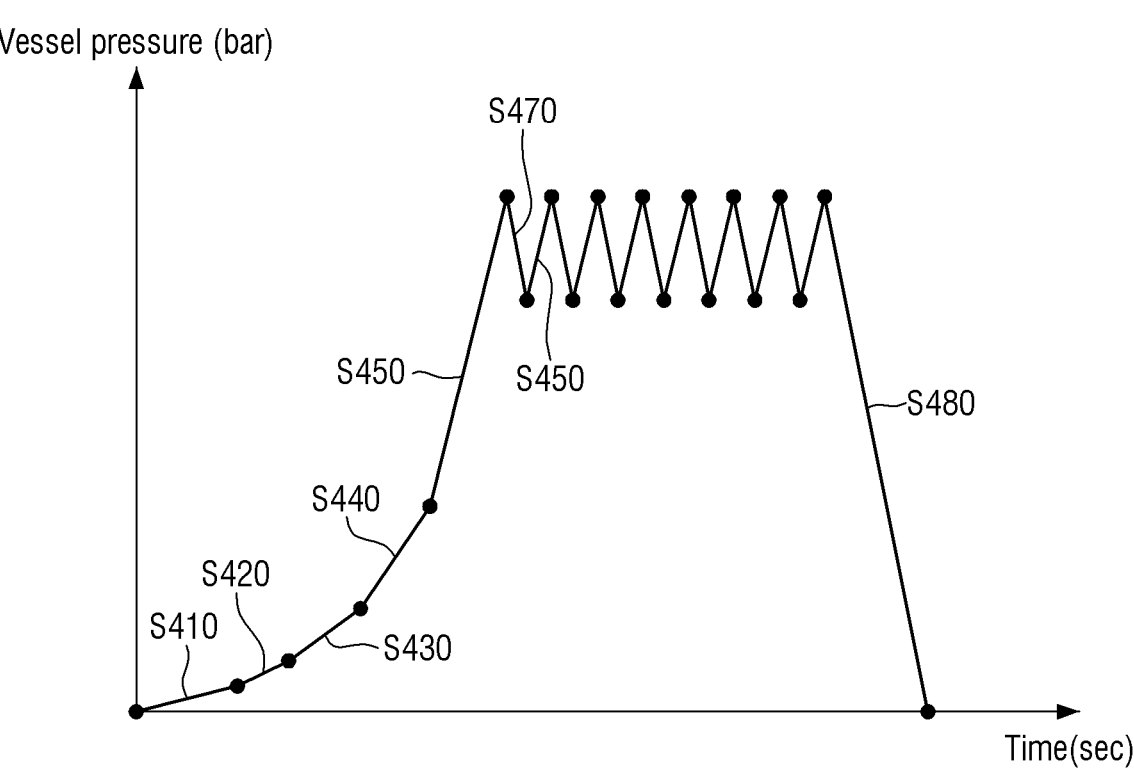
FIG. 4 is a graph illustrating a time-specific pressure distribution in a process chamber and the substrate processing method of FIG. 3 in combination.

FIG. 3 is a flow chart illustrating a substrate processing method using a supercritical fluid according to one embodiment of the present disclosure, and FIG. 4 is a graph illustrating a time-specific pressure distribution in a process chamber and the substrate processing method of FIG. 3 in combination.

The substrate processing method of FIG. 3 may be performed by the substrate processing apparatus of FIG. 2. The following description will be made with reference to FIGS. 2 to 4.

In FIG. 4, first to fifth steps S410 to S450 are pressurizing steps, a time period for which step S470 and fifth step S450 are repeated is a processing step, and step S480 is a decompression step.

First of all, a substrate W coated with a chemical liquid is inserted into the process chamber 100.

Subsequently, a supercritical fluid $CO_2$ is supplied into the process chamber 100 through pressurizing steps. The pressurizing steps may include a first step S410, a second step S420, a third step S430, a fourth step S440, and a fifth step S450.

In detail, the supercritical fluid $CO_2$ is supplied from the supercritical fluid reservoir 200 to the process chamber 100 through the supply pipe 153 (i.e., main supply line) (S410). In the present embodiment, the supercritical fluid may be provided at a first pressure or a first speed. The first step S410 may be performed for 3 seconds to 20 seconds.

In this case, only a portion of the plurality of the pressure control valve 310 may be opened to supply the supercritical fluid $CO_2$ at a low flow rate/low pressure. Also, according to embodiments, an opening and closing surface of a single one of the pressure control value 310 or a small number of the pressure control valve 310 may partially be opened such that the supercritical fluid $CO_2$ may be provided at a low flow rate/low pressure.

Figure 5:
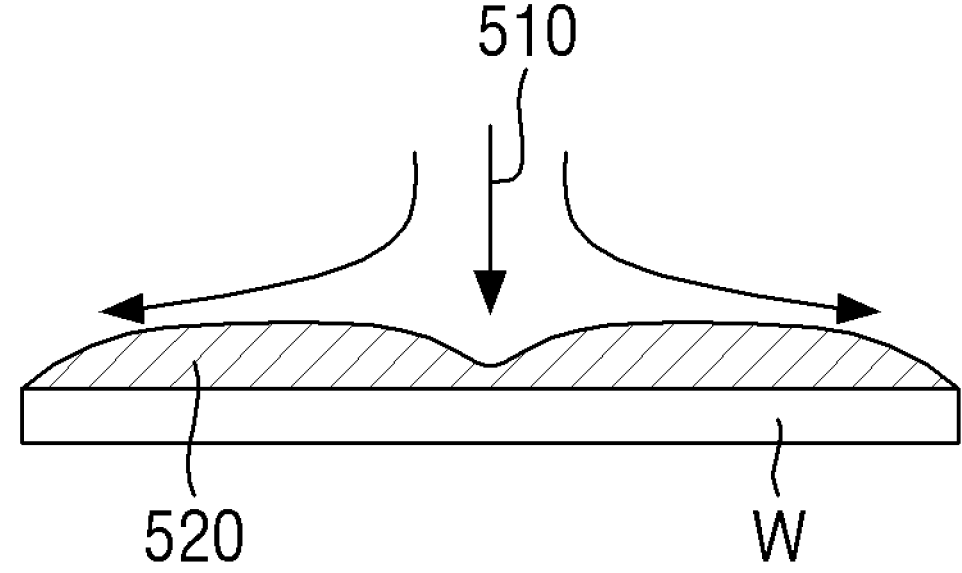
FIG. 5 is a first example view illustrating each step of the substrate processing method shown in FIG. 3.

For example, when five of the pressure control valve 310 is installed, the second pressure control valve 310b to the fifth pressure control valve 310e may be closed, and only the first pressure control valve 310a may be opened, whereby the supercritical fluid may be provided at a first flow rate. In this case, as shown in FIG. 5, a supercritical fluid 510 moves onto the substrate W coated with the chemical liquid 520 at a very slow speed (first speed), thereby pushing the chemical liquid 520 from the center to the edge (Center-to-Edge) ($CO_2$ Very Slow Fill). FIG. 5 is a first example view illustrating a step of the substrate processing method shown in FIG. 3.

Afterwards, as the time passes, the first flow rate may be gradually increased, the first pressure may be gradually increased, or the first speed may be gradually increased to provide the supercritical fluid $CO_2$ from the supercritical fluid reservoir 200 to the process chamber 100 (S420 to S450).

In the present embodiment, as the time passes, the number of valves that are opened may be increased, or an area opened in the valve may be enlarged, whereby the first flow rate may be gradually increased, the first pressure may be gradually increased, or the first speed may be gradually increased. For example, an increase in flow rate/pressure/speed may follow an exponential function.

A detailed description of the second to fifth steps S420 to S450 will be described in sequence.

First of all, the supercritical fluid is provided from the supercritical fluid reservoir 200 to the process chamber 100 at a second flow rate greater than the first flow rate (S420). In the present embodiment, the supercritical fluid may be provided at a second pressure higher than the first pressure, and may be provided at a second speed faster than the first speed. The second step S420 may be performed for 3 seconds to 20 seconds.

As described above, when five of the pressure control valve 310 is installed, the first pressure control valve 310a to the fifth pressure control valve 310e may be different from one another in magnitudes of pressures that may be controlled. Alternatively, the first pressure control valve 310a to the fifth pressure control valve 310e may be the same as one another in magnitudes of pressures that may be controlled.

Figure 6:
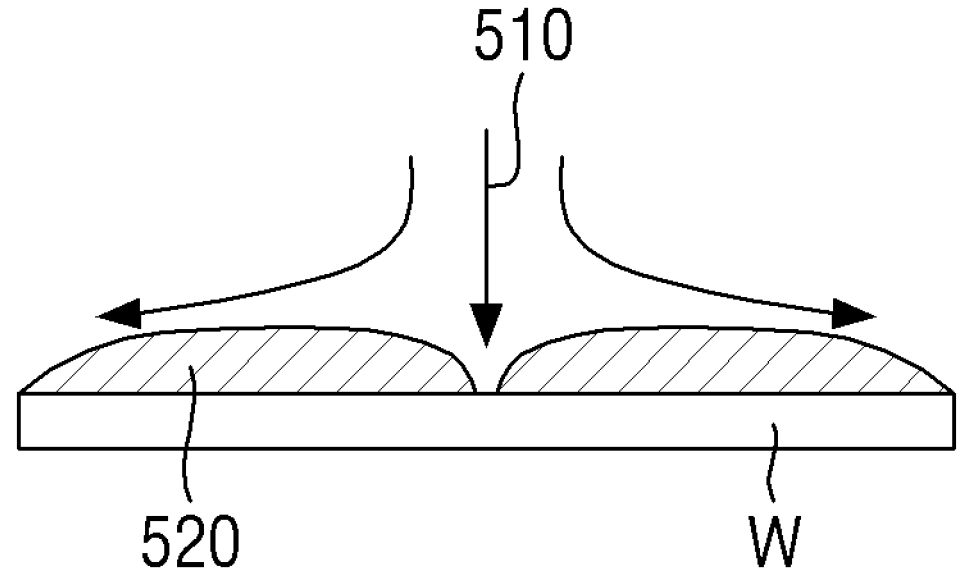
FIG. 6 is a second example view illustrating each step of the substrate processing method shown in FIG. 3.

When the first pressure control valve 310a to the fifth pressure control valve 310e are controlled at different pressures (e.g., the relatively greater to lesser pressure is controlled in the order of the fifth pressure control valve 310e, the fourth pressure control valve 310d, the third pressure control valve 310c, the second pressure control valve 310b and the first pressure control valve 310a) the first pressure control valve 310a, the pressure third pressure control valve 310c, the fourth pressure control valve 310d, and the fifth pressure control valve 310e may be closed, and only the second pressure control valve 310b may be opened to provide the supercritical fluid at the second flow rate. In this case, as shown in FIG. 6, the supercritical fluid 510 may move onto the substrate W coated with the chemical liquid 520 at a relatively slow speed (the second speed faster than the first speed), thereby pushing the chemical liquid 520 from the center to the edge (Center-to-Edge) ($CO_2$ Slow Fill). FIG. 6 is a second example view illustrating a step of the substrate processing method shown in FIG. 3.

Meanwhile, when the first pressure control valve 310a to the fifth pressure control valve 310e are controlled at the same pressure, the second pressure control valve 310b may be opened subsequently to the first pressure control valve 310a, and the other control valves, that is, the third pressure control valve 310c to the fifth pressure control valve 310e may be closed to provide the supercritical fluid at the second flow rate.

Next, the supercritical fluid is supplied from the supercritical fluid reservoir 200 to the process chamber 100 at a third flow rate greater than the second flow rate (S430). In the present embodiment, the supercritical fluid may be provided at a third pressure higher than the second pressure, and the supercritical fluid may be provided at a third speed faster than the second speed. The third step S430 may be performed for 3 seconds to 20 seconds.

Figure 7:
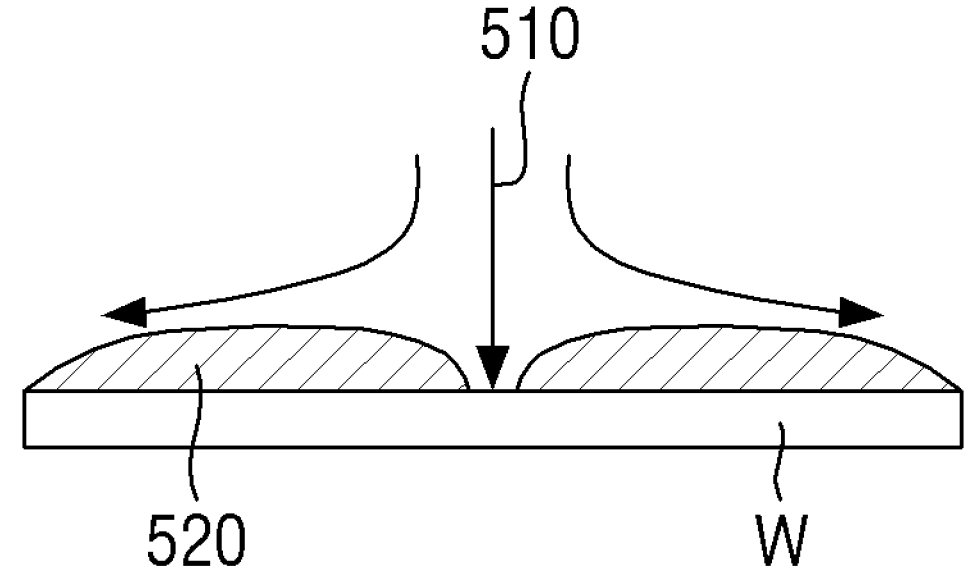
FIG. 7 is a third example view illustrating each step of the substrate processing method shown in FIG. 3.

When the first pressure control valve 310a to the fifth pressure control valve 310e are controlled at different pressures (e.g., the relatively greater to lesser pressure is controlled in the order of the fifth pressure control valve 310e, the fourth pressure control valve 310d, the third pressure control valve 310c, the second pressure control valve 310b and the first pressure control valve 310a), the first pressure control valve 310a, the second pressure control valve 310b, the fourth pressure control valve 310d, and the fifth pressure control valve 310e may be closed, and only the third pressure control valve 310c may be opened to provide the supercritical fluid at the third flow rate. In this case, as shown in FIG. 7, the supercritical fluid 510 may move onto the substrate W coated with the chemical liquid 520 at a normal speed (the third speed faster than the second speed), thereby pushing the chemical liquid 520 from the center to the edge (Center-to-Edge) ($CO_2$ Normal Speed Fill). FIG. 7 is a third example view illustrating a step of the substrate processing method shown in FIG. 3.

Meanwhile, when the first pressure control valve 310a to the fifth pressure control valve 310e are controlled at the same pressure, the third pressure control valve 310c may be opened subsequently to the first pressure control valve 310a and the second pressure control valve 310b, and the other control valves, that is, the fourth pressure control valve 310d and the fifth pressure control valve 310e may be closed to provide the supercritical fluid at the third flow rate.

Next, the supercritical fluid is supplied from the supercritical fluid reservoir 200 to the process chamber 100 at a fourth flow rate greater than the third flow rate (S440). In the present embodiment, the supercritical fluid may be provided at a fourth pressure higher than the third pressure, and the supercritical fluid may be provided at a fourth speed faster than the third speed. The fourth step S440 may be performed for 3 seconds to 20 seconds.

Figure 8:
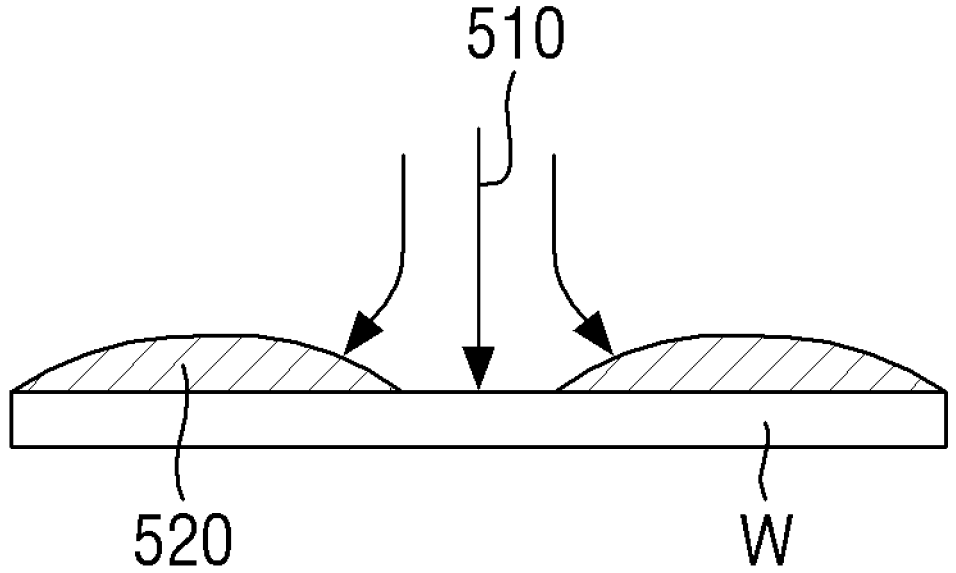
FIG. 8 is a fourth example view illustrating each step of the substrate processing method shown in FIG. 3.

When the first pressure control valve 310a to the fifth pressure control valve 310e are controlled at different pressures (e.g., the relatively greater to lessure pressure is controlled in the order of the fifth pressure control valve 310e, the fourth pressure control valve 310d, the third pressure control valve 310c, the second pressure control valve 310b, and the first pressure control valve 310a), the first pressure control valve 310a, the second pressure control valve 310b, the third pressure control valve 310c, and the fifth pressure control valve 310e may be closed, and only the fourth pressure control valve 310d may be opened to provide the supercritical fluid at the fourth flow rate. In this case, as shown in FIG. 8, the supercritical fluid 510 may move onto the substrate W coated with the chemical liquid 520 at a relatively fast speed (the fourth speed faster than the third speed), thereby pushing the chemical liquid 520 from the center to the edge (Center-to-Edge) ($CO_2$ Quick Fill). FIG. 8 is a fourth example view illustrating a step of the substrate processing method shown in FIG. 3.

Meanwhile, when the first pressure control valve 310a to the fifth pressure control valve 310e are controlled at the same pressure, the fourth pressure control valve 310d may be opened subsequently to the first pressure control valve 310a to the third pressure control valve 310c, and the other control valve, that is, the fifth pressure control valve 310e may be closed to provide the supercritical fluid at the fourth flow rate.

Next, the supercritical fluid is supplied from the supercritical fluid reservoir 200 to the process chamber 100 at a fifth flow rate greater than the fourth flow rate (S450). In the present embodiment, the supercritical fluid may be provided at a fifth pressure higher than the fourth pressure, and the supercritical fluid may be provided at a fifth speed faster than the fourth speed. The fifth step S450 may be performed for 3 seconds to 20 seconds.

Figure 9:
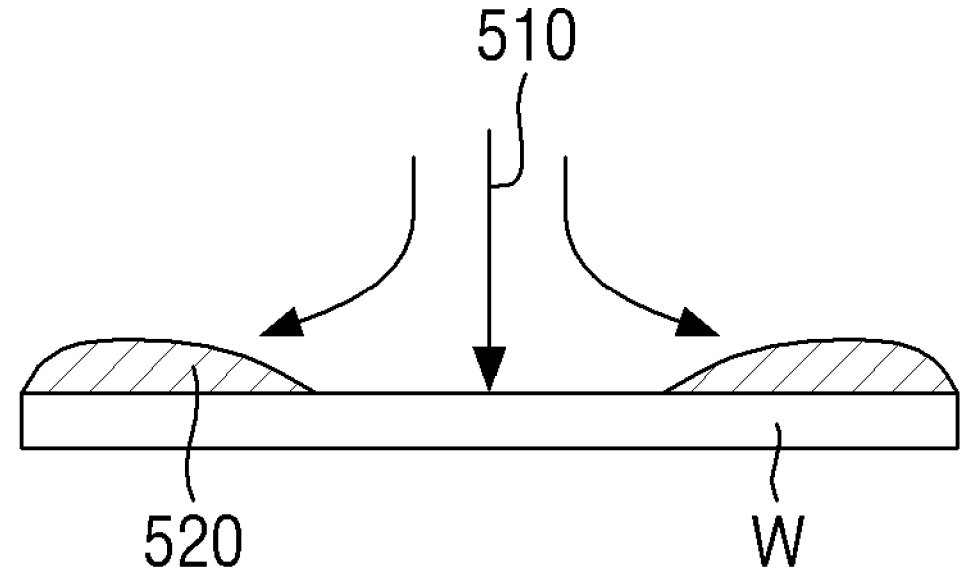
FIG. 9 is a fifth example view illustrating each step of the substrate processing method shown in FIG. 3.

When the first pressure control valve 310a to the fifth pressure control valve 310e are controlled at different pressures (e.g., the relatively greater to lesser pressure is controlled in the order of the fifth pressure control valve 310e, the fourth pressure control valve 310d, the third pressure control valve 310c, the second pressure control valve 310b, and the first pressure control valve 310a), the first pressure control valve 310a, the second pressure control valve 310b, the third pressure control valve 310c, and the fourth pressure control valve 310d may be closed, and only the fifth pressure control valve 310e may be opened to provide the supercritical fluid at the fifth flow rate. In this case, as shown in FIG. 9, the supercritical fluid 510 may move onto the substrate W coated with the chemical liquid 520 at a very fast speed (the fifth speed faster than the fourth speed), thereby pushing the chemical liquid 520 from the center to the edge (Center-to-Edge) ($CO_2$ Very Quick Fill). FIG. 9 is a fifth example view illustrating a step of the substrate processing method shown in FIG. 3.

Meanwhile, when the first pressure control valve 310a to the fifth pressure control valve 310e are controlled at the same pressure, the fifth pressure control valve 310e may be also opened subsequently to the first pressure control valve 310a to the fourth pressure control valve 310d, whereby the supercritical fluid may be provided at the fifth flow rate.

In the fifth step S450, the inside of the process chamber 100 may reach the highest pressure. Therefore, in the present embodiment, the second exhaust control valve 320 installed on the exhaust member 170 may be opened to discharge a portion of the supercritical fluid inside the process chamber 100 to the outside (S470), and then the fifth step S450 may be performed. This process may be repeated N times (S460). The N times may be varied depending on the amount of the chemical liquid 520 remaining on the substrate W or the remaining amount of fume.

Figure 10:
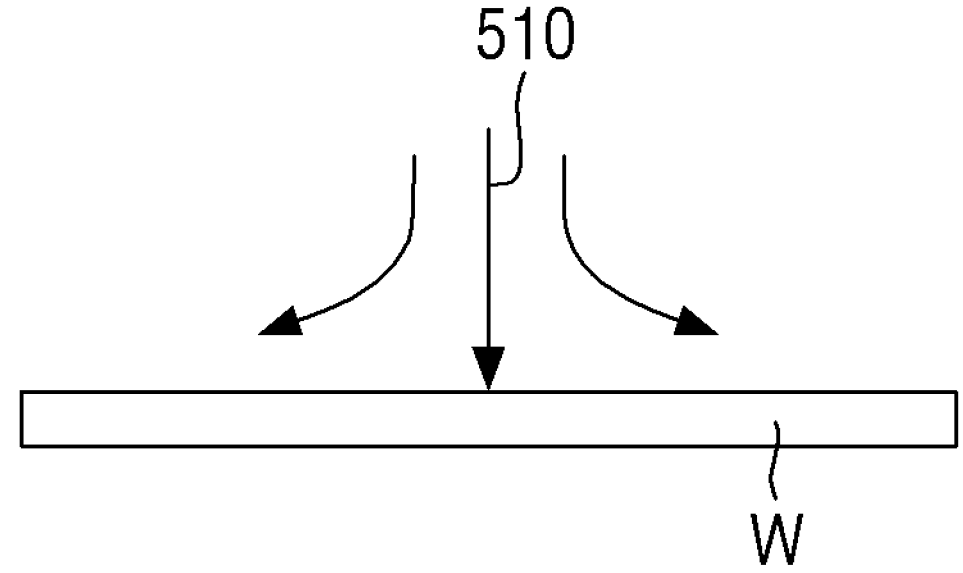
FIG. 10 is a sixth example view illustrating each step of the substrate processing method shown in FIG. 3.

The steps S450 to S470 may be repeated until the chemical liquid 520 is removed from the substrate W as shown in FIG. 10, and in this case, N is a natural number of 1 to 32. FIG. 10 is a sixth example view illustrating a step of the substrate processing method shown in FIG. 3.

When the drying of the substrate W using the supercritical fluid is completed through steps S410 through S470, the supercritical fluid is discharged to the outside until the inside of the process chamber 100 reaches the atmospheric pressure (S480).

Afterwards, the process of drying the substrate W is terminated, and the substrate W is taken out of the process chamber 100 (S490).

Figure 15:
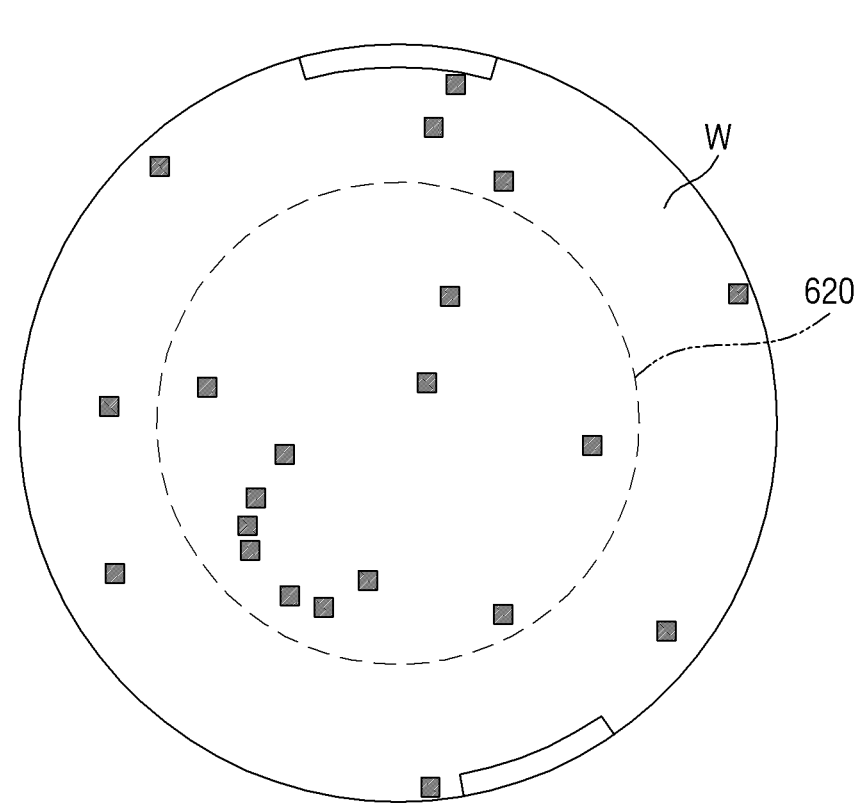
FIG. 15 is a view illustrating a defect map of an embodiment of the present disclosure when a supercritical fluid is supplied to perform supercritical drying.

In embodiments of the present disclosure, when the supercritical fluid is supplied onto the substrate W (e.g., wafer) in the process chamber 100 for supercritical drying as described above, the supercritical fluid may be initially provided at a low pressure/low flow rate, and then may be provided at a predetermined boosting speed through the pressure control for each step. Then, as described with reference to FIGS. 5 to 10, since the developing solution on the surface of the substrate W is uniformly pushed from the center to the edge (Center-to-Edge) by the supercritical fluid of a certain increment to dry the substrate W, predetermined patterns 620 may be dispersed on the surface of the substrate W to control the substrate W as shown in FIG. 15, whereby clustered cluster defects may not occur. FIG. 15 is a view illustrating a defect map of an embodiment of the present disclosure when a supercritical fluid is supplied to perform supercritical drying.

Meanwhile, in embodiments of the present disclosure, a single supply vent or a multi-supply vent is further provided in the pipe to induce a constant start pressure and lower a boosting speed to a maximum range until initial 5 seconds, so that occurrence of defects generated as the developing solution is rapidly dried or locally dried in the process chamber 100 in which the drying process is performed may be minimized. This will be described as follows.

Figure 11:
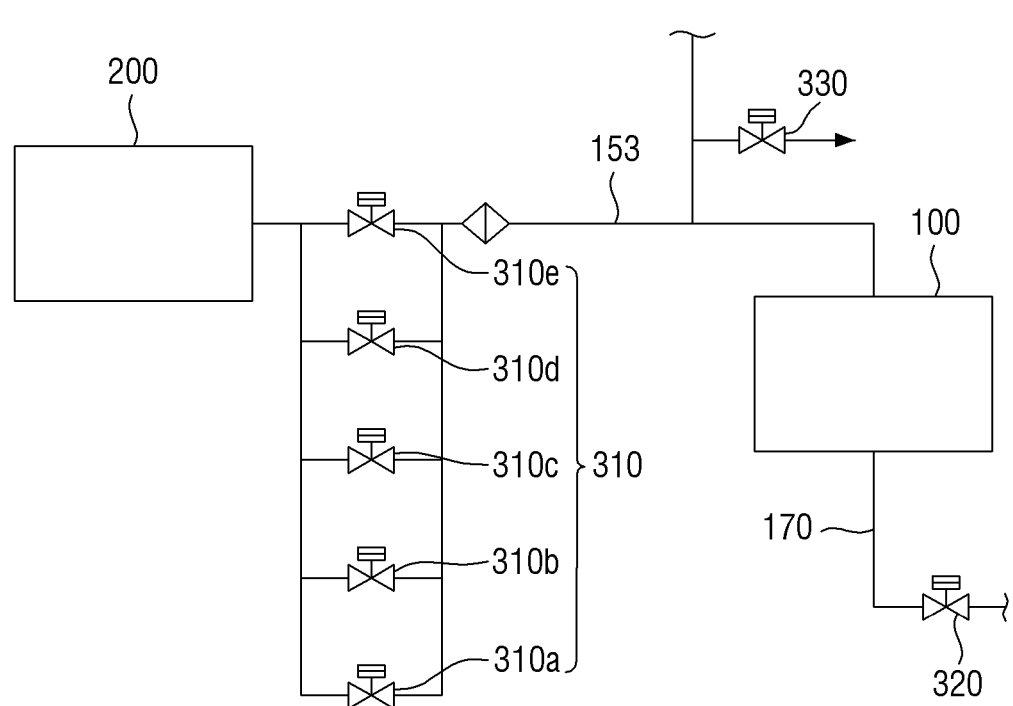
FIG. 11 is a second example view schematically illustrating an internal structure of a substrate processing apparatus according to one embodiment of the present disclosure.

FIG. 11 is a second example view schematically illustrating an internal structure of a substrate processing apparatus according to one embodiment of the present disclosure.

Referring to FIG. 11, a substrate processing apparatus 300 may include a supercritical fluid reservoir 200, a pressure control valve 310, a process chamber 100, a second exhaust control valve 320 and a first exhaust control valve 330.

The supercritical fluid reservoir 200, the pressure control valve 310, and the second exhaust control valve 320 have been described with reference to FIG. 2 and thus detailed description thereof will not be repeated.

In this case, the fluid supply unit includes a supercritical fluid reservoir 200, a pressure control valve 310 and the like. A venting unit includes a first exhaust control valve 330 and the like. The venting unit further includes a plurality of venting lines connected in parallel with the supply pipe 153.

First to third pressure control valves 330a, 330b, and 330c may be installed in the plurality of venting lines, respectively.

The first exhaust control valve 330 is provided to discharge the supercritical fluid, which moves from the supercritical fluid reservoir 200 towards the process chamber 100, to the outside. The first exhaust control valve 330 may be installed on the supply pipe 153 for connecting the supercritical fluid reservoir 200 with the process chamber 100. In detail, the first exhaust control valve 330 may be installed on the supply pipe 153, on a side of the pressure control valve 310 towards the process chamber 100.

Figure 12:
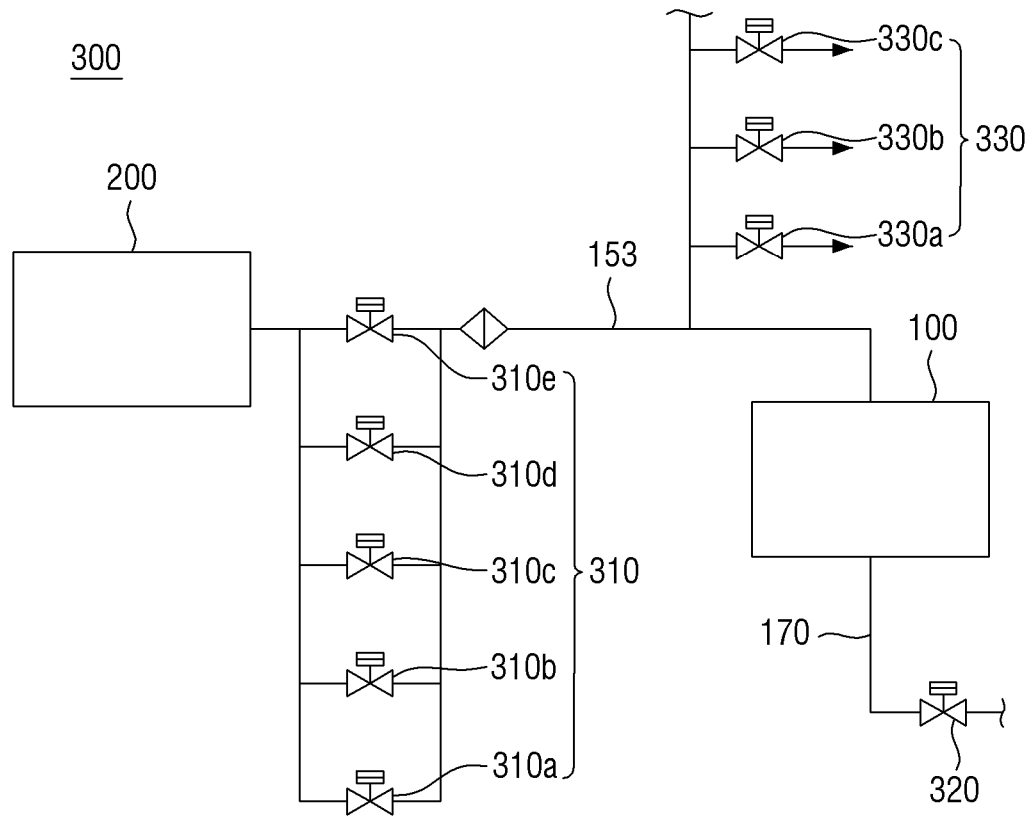
FIG. 12 is a third example view illustrating an internal structure of a substrate processing apparatus according to one embodiment of the present disclosure.

The first exhaust control valve 330 may be installed on the supply pipe 153 as a single piece, but embodiments of the present disclosure are not limited thereto. A plurality of the first exhaust control valve 330 may be installed on the supply pipe 153. For example, the first to third pressure control valves 330a, 330b, and 330c may be installed as the first exhaust control valve 330 as shown in FIG. 12. When the plurality of the first exhaust control valve 330 is installed on the supply pipe 153, the plurality of the first exhaust control valve 330 (e.g., the first to third pressure control valves 330a, 330b, and 330c) may be connected with one another in parallel. FIG. 12 is a third example view illustrating an internal structure of a substrate processing apparatus according to one embodiment of the present disclosure.

The first exhaust control valve 330 may be provided in an initial opened state. The first exhaust control valve 330 may then be provided in a gradually closed state in accordance with the supply amount of the supercritical fluid. When the plurality of the first exhaust control valve 330 is installed, the plurality of the first exhaust control valve 330 may be provided in a sequentially closed state as time passes.

When a single first exhaust control valve 330 is installed on the supply pipe 153 as shown in FIG. 11, in the example of FIG. 3, the first exhaust control valve 330 may be provided in an opened state in the first step S410 of providing the supercritical fluid at the first flow rate (Supply Vent Opening). Then, the first exhaust control valve 330 may be provided in a closed state from the second step S420 of providing the supercritical fluid at the second flow rate (Supply Vent Closed). Otherwise, the first exhaust control valve 330 may be provided in a closed state from the third step S430 of providing the supercritical fluid at the third flow rate. Otherwise, the first exhaust control valve 330 may be provided in a closed state from the fourth step S440 of providing the supercritical fluid at the fourth flow rate. Otherwise, the first exhaust control valve 330 may be provided in a closed state from the fifth step S450 of providing the supercritical fluid at the fifth flow rate.

When a plurality of the first exhaust control valve 330 is installed on the supply pipe 153 (e.g., the first to third pressure control valves 330a, 330b, and 330c are installed as shown in FIG. 12), in the first step S410 of providing the supercritical fluid at the first flow rate in the example of FIG. 3, the first to third pressure control valves 330a, 330b, and 330c may be provided in an opened state (Supply Vent All Opened). Then, in the second step S420 of providing the supercritical fluid at the second flow rate, the third pressure control valve 330c from among the first to third pressure control valves 330a, 330b, and 330c may be closed and the first to second pressure control valves 330a and 330b may be maintained in an opened state (Supply Vent Partly Closed). Afterwards, in the step third S430 of providing the supercritical fluid at the third flow rate, the second to third pressure control valves 330b and 330c from among the first to third pressure control valves 330a, 330b, and 330c may be closed and the first pressure control valve 330a may be maintained in an opened state (Supply Vent Partly Closed). Then, in the fourth step S440 of providing the supercritical fluid at the fourth flow, the first to third pressure control valves 330a, 330b, and 330c may be all closed (Supply Vent All Closed).

Otherwise, in the second step S420 of providing the supercritical fluid at the second flow rate, the third pressure control valve 330c from among the first to third pressure control valves 330a, 330b, and 330c may be closed and the first to second pressure control valves 330a and 330b may be maintained in an opened state, and in the fourth step S440 of providing the supercritical fluid at the fourth flow, the second to third pressure control valves 330b and 330c from among the first to third pressure control valves 330a, 330b, and 330c may be closed and the first pressure control valve 330a may be maintained in an opened state. Afterwards, in the fifth step S450 of providing the supercritical fluid at the fifth flow rate, the first to third pressure control valves 330a, 330b, and 330c may be all closed.

Otherwise, in the third step S430 of providing the supercritical fluid at the third flow rate, the third pressure control valve 330c from among the first to third pressure control valves 330a, 330b, and 330c may be closed and the first to second pressure control valves 330a and 330b may be maintained in an opened state, and in the fourth step S440 of providing the supercritical fluid at the fourth flow rate, the second to third pressure control valves 330b and 330c from among the first to third pressure control valves 330a, 330b, and 330c may be closed and the first pressure control valve 330a may be maintained in an opened state. Afterwards, in the fifth step S450 of providing the supercritical fluid at the fifth flow rate, the first to third pressure control valves 330a, 330b, and 330c may be all closed.

Meanwhile, in the present embodiment, a multi-level supply vent may be controlled in accordance with a thickness of the chemical liquid 520 on the substrate W. Hereinafter, a case where first to third pressure control valves 330a, 330b, and 330c are installed as the plurality of the first exhaust control valve 330 will be described by way of example.

Figure 16A:
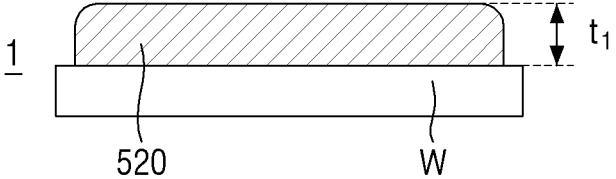
FIG. 16A is a first sub-view of a first example view illustrating a control method of a first exhaust control valve according to a thickness of a chemical liquid.
Figure 16B:
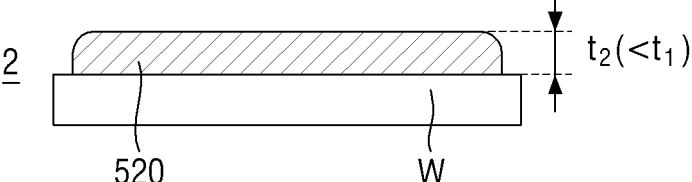
FIG. 16B is a second sub-view of the first example view illustrating the control method of the first exhaust control valve according to the thickness of the chemical liquid.
Figure 16C:
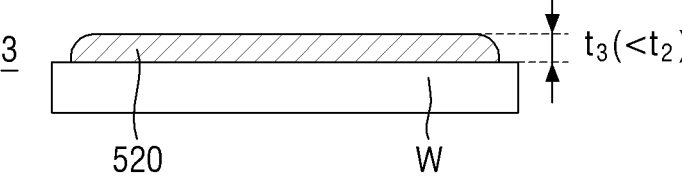
FIG. 16C is a third sub-view of the first example view illustrating the control method of the first exhaust control valve according to the thickness of the chemical liquid.
Figure 17:
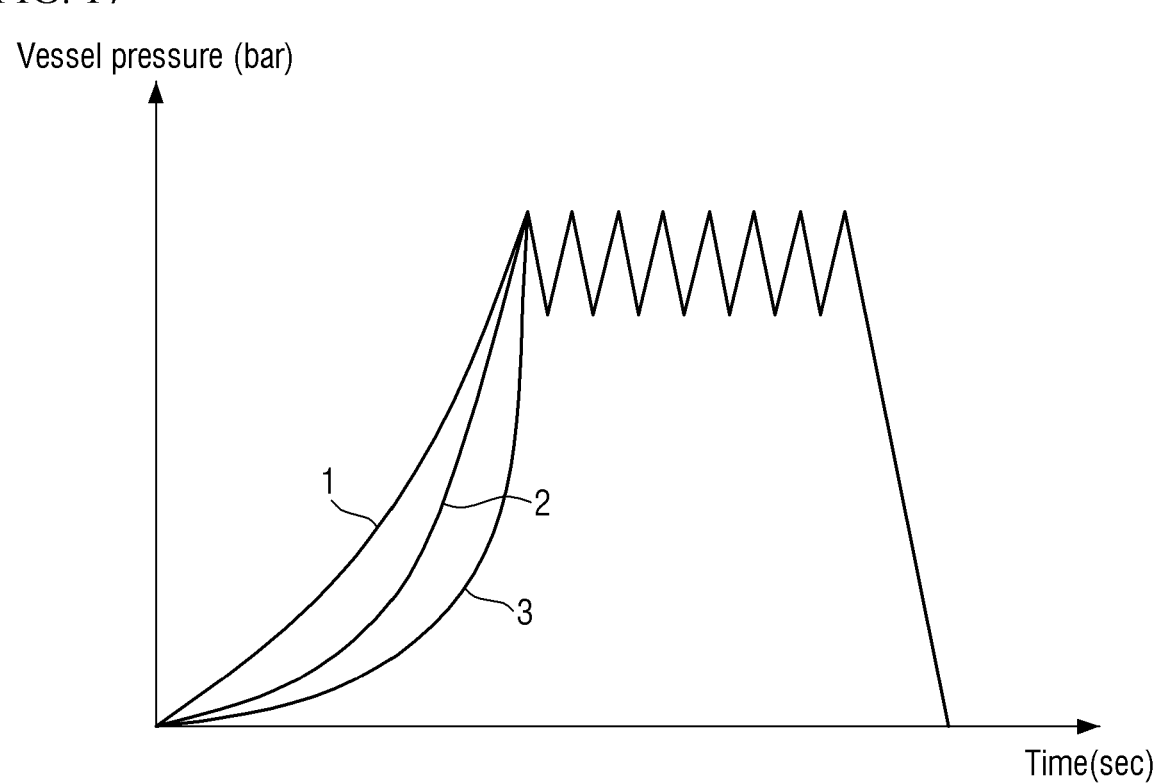
FIG. 17 is a second example view illustrating a control method of the first exhaust control valve according to the thickness of the chemical liquid.

FIGS. 16A-C are sub-views of a first example view illustrating a control method of a first exhaust control valve according to a thickness of a chemical liquid, and FIG. 17 is a second example view illustrating a control method of a first exhaust control valve according to a thickness of a chemical liquid.

When the chemical liquid 520 is thick, the supply amount of the supercritical fluid should be increased in order to complete the drying of the substrate W in a short time. On the other hand, when the chemical liquid 520 is thin, even though the supply amount of the supercritical fluid is relatively reduced, the drying of the substrate W may be completed in a short time.

In the present embodiment, in consideration of this aspect, when the thickness of the chemical liquid 520 is t1, the first to third pressure control valves 330a, 330b, and 330c may be controlled to be all closed in the second step S420 of providing the supercritical fluid at the second flow rate (see example 1 in FIGS. 16A and 17).

On the other hand, when the thickness of the chemical liquid 520 is t2(<t1), in the second step S420 of providing the supercritical fluid at the second flow rate, only the first to second pressure control valves 330a and 330b from among the first to third pressure control valves 330a, 330b, and 330c may be controlled to be closed and the third pressure control valve 330c may be controlled to maintain an opened state (see example 2 in FIGS. 16B and 17).

Meanwhile, when the thickness of the chemical liquid 520 is t3(<t2<t1), in the second step S420 of providing the supercritical fluid at the second flow rate, only the first pressure control valve 330a from among the first to third pressure control valves 330a, 330b, and 330c may be controlled to be closed and the second to third pressure control valves 330b and 330c may be controlled to maintain an opened state (see example 3 in FIGS. 16C and 17).

The method for controlling the first to third pressure control valves 330a, 330b, and 330c in the second step S420 of providing the supercritical fluid at the second flow rate has been described as above, and this multi-valve control method may be applied to the third step S430 of providing the supercritical fluid at the third flow rate, and may be applied to the fourth step S440 of providing the supercritical fluid at the fourth flow rate.

In embodiments of the present disclosure, as shown in FIG. 4, the substrate processing apparatus 300 may lower the existing boosting speed to a maximum range when the supercritical fluid reservoir 200 is turned on in an initial supply vent open state (that is, the boosting speed may follow an exponential function not a log function or a linear function), and enables stable $CO_2$ injection through multi-level fill, that is, the plurality of the pressure control valve 310.

Figure 14:
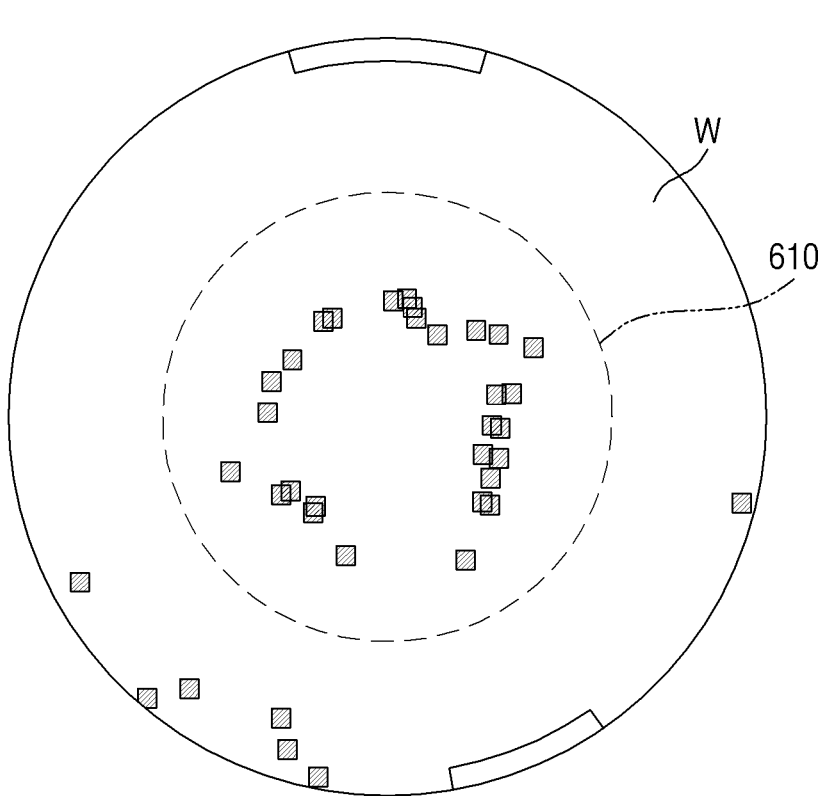
FIG. 14 is a view illustrating a conventional defect map when a supercritical fluid is supplied to perform supercritical drying.

Meanwhile, when the $CO_2$ fluid flows into the process chamber in a comparative supply apparatus, a clustered defect 610 is generated in a partial area on the substrate W due to an initial high boosting speed as shown in FIG. 14, and particularly, it has been noted that the clustered defect 610 of a concentric circle shape is limitedly caused in accordance with an area that pushes the developing solution due to a fast speed. FIG. 14 is a view illustrating a defect map when a supercritical fluid is supplied to perform supercritical drying.

When Fill Time is controlled to solve clustered defects, only the area where the developing solution is dried is changed, and the clustered defects of a concentric circle shape still remain. In the substrate processing apparatus 300 according to embodiments of the present disclosure, these problems may be solved by control of the initial boosting speed.

That is, as shown in FIGS. 5 to 10, as $CO_2$ flows into the process chamber 100 at an initial low pressure and the developing solution is pushed in a wetting state. When the process is performed by gradually subdividing a boosting time period, it is noted that the existing clustered defects are solved as shown in FIG. 15.

Therefore, in embodiments of the present disclosure, hunting caused by pressure over-shooting may be removed and stable supply may be made when $CO_2$ is initially supplied into the pipe through the supply vent, and $CO_2$ supplied to the inside of the process chamber 100 may be induced to be supplied at a low boosting speed.

Figure 13:
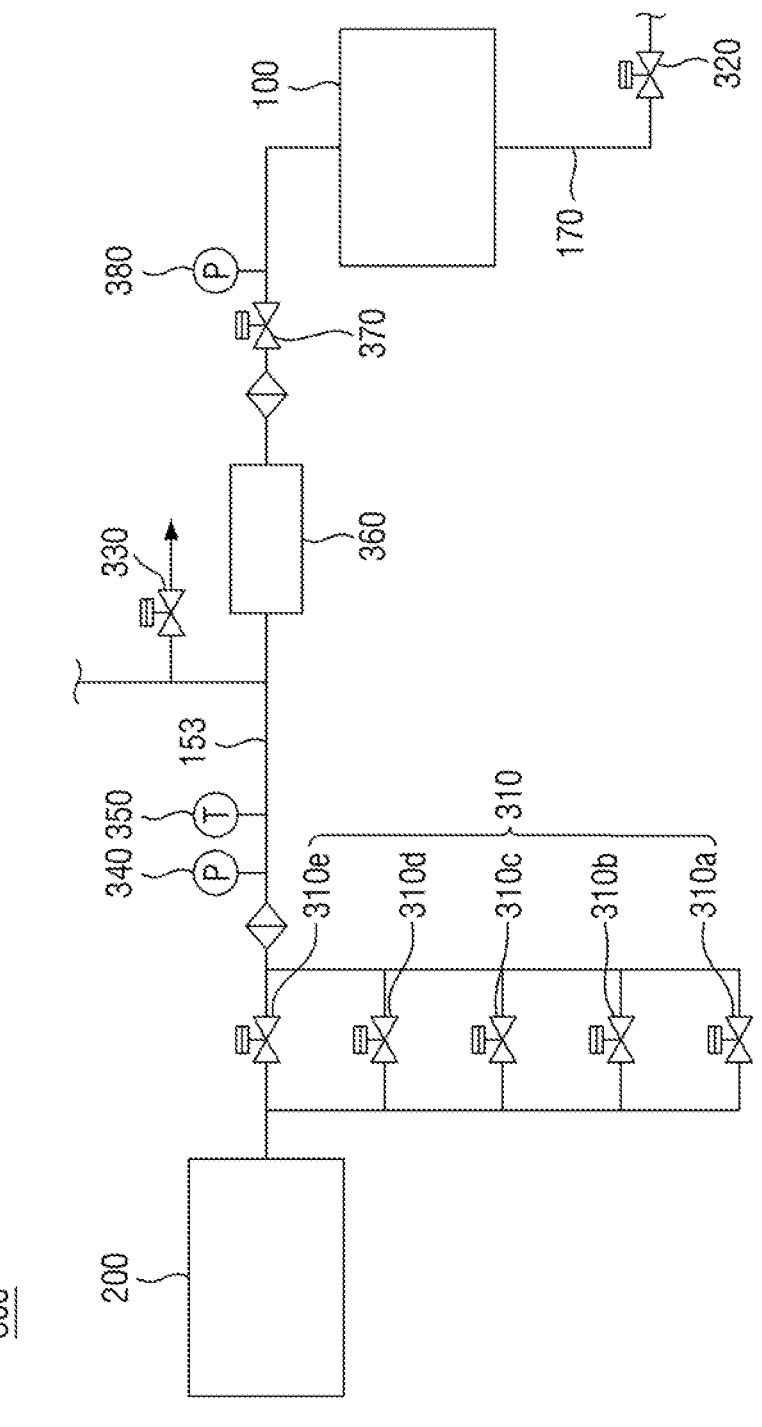
FIG. 13 is a fourth example view schematically illustrating an internal structure of a substrate processing apparatus according to one embodiment of the present disclosure.

According to embodiments, with reference to FIG. 13, the substrate processing apparatus 300 may include a first pressure measuring module 340, a temperature measuring module 350, a heater 360, an opening/closing control valve 370, and a second pressure measuring module 380, in addition to the supercritical fluid reservoir 200, the pressure control valve 310, the process chamber 100, the second exhaust control valve 320, and the first exhaust control valve 330.

FIG. 13 is a fourth example view schematically illustrating an internal structure of a substrate processing apparatus according to one embodiment of the present disclosure.

The first pressure measuring module 340 measures a pressure of the supercritical fluid that passes through the supply pipe 153. The first pressure measuring module 340 may measure the pressure of the supercritical fluid that has passed through the pressure control valve 310, and may use the measured pressure to check whether the supercritical fluid is initially supplied to the process chamber 100 at a low flow rate/low pressure.

The first pressure measuring module 340 may be installed on the supply pipe 153 for connecting the supercritical fluid reservoir 200 with the process chamber 100. In detail, the first pressure measuring module 340 may be installed between the pressure control valve 310 and the first exhaust control valve 330. According to embodiments, the first pressure measuring module 340 may include a pressure sensor.

The temperature measuring module 350 measures a temperature of the supercritical fluid that passes through the supply pipe 153. The temperature measuring module 350 may be installed on the supply pipe 153 for connecting the supercritical fluid reservoir 200 with the process chamber 100, and more particularly, may be installed between the pressure control valve 310 and the first exhaust control valve 330. According to embodiments, the temperature measuring module 350 may include a temperature sensor.

The heater 360 may be configured to heat the supercritical fluid that passes through the supply pipe 153. The heater 360 may be disposed after the temperature measuring module 350 to heat the supercritical fluid in accordance with the measured result of the temperature measuring module 350.

The opening/closing control valve 370 may be provided to adjust the flow rate of the supercritical fluid supplied to the upper fluid supply 151 and the lower fluid supply 152. To this end, the opening/closing control valve 370 may be installed on the supply pipe 153 for connecting the supercritical fluid reservoir 200 with the process chamber 100, and more particularly may be installed after the heater 360.

The second pressure measuring module 380 may be configured to measure the pressure of the supercritical fluid that passes through the supply pipe 153. The second pressure measuring module 380 measures the pressure of the supercritical fluid that has passed through the first exhaust control valve 330, and may use the measured pressure to check whether the supercritical fluid is initially supplied to the process chamber 100 at a low flow rate/low pressure. According to embodiments, the second pressure measuring module 380 may include a pressure sensor.

According to embodiments, the opening/closing control valve 370 and the second pressure measuring module 380 may not be provided in the substrate processing apparatus 300.

Embodiments of the present disclosure relate to a supercritical developer equipment based on supercritical fluid ($CO_2$) supply pressure control, as described with reference to FIGS. 1 to 17. Embodiments of the present disclosure may be applied to a supercritical drying process that may be performed by a photo process of a semiconductor manufacturing process, specifically a cleaning process after a developing process. According to embodiments of the present disclosure, the flow rate and the boosting speed of the supercritical high pressure $CO_2$ are distributed through a supply stage venting system configuration, so that the flow rate and the pressure in the process chamber 100 may be controlled to effectively deal with the defect control.

In a comparative supply apparatus, even a $CO_2$ supercritical arrival pressure is controlled by a set reservoir pressure and a single level control device. Therefore, it is difficult to implement a desired boosting speed at a desired time zone. In embodiments of the present disclosure, the process flow chart described with reference to FIGS. 3 and 4 may be implemented, the initial boosting speed may be implemented in multiple stages through the multi-level fill based on the plurality of the pressure control valve 310 and the supply vent based on the first exhaust control valve 330, and the initial $CO_2$ slow fill may prevent the wetting developing solution from being rapidly dried, thereby providing great assistance in solving the defect problem. The supply vent based on the first exhaust control valve 330 may be either a single supply vent based on a single first exhaust control valve 330 and a multi supply vent based on the plurality of the first exhaust control valve 330.

In addition, embodiments of the present disclosure are advantageous in that a supply vent is structurally provided prior to the process chamber 100 and the supply is controlled just before entering the process chamber 100. Since there is previously no technology capable of stably controlling all areas from the low pressure to the high pressure ($CO_2$ supercritical implementation) with respect to a flow rate control system for implementing a corresponding boosting curve, embodiments of the present disclosure may solve the defect problems of the corresponding process in accordance with the process/equipment methods proposed herein.

According to one or more embodiments, the substrate processing apparatus 300 may further include at least one processor and memory storing computer instructions. The computer instructions, when executed by the at least one processor, may be configured to cause the at least one processor to control any number of components of the substrate processing apparatus 300 to perform their functions. For example, the computer instructions may be configured to cause the at least one processor to cause one or more of the substrate processing methods of embodiments of the present disclosure to be performed by controlling, for example, the pressure control valve 310 (e.g., the first to fifth pressure control valves 310a-310e), the first exhaust control valve 330 (e.g., the first to third pressure control valves 330a-330c), the second exhaust control valve 320, the process chamber 100, the heater 360, the opening/closing control valve 370, etc., to perform their respective functions. According to embodiments, the computer instructions may be configured to cause the at least one processor to cause the components to perform their respective functions based on at least one sensor reading from a sensor (e.g., from the first pressure measuring module 340, from the temperature measuring module 350, from the second pressure measuring module 380, and/or another sensor). According to embodiments, the at least one processor may be connected to the aforementioned components by either wired means (e.g., via a wire) or wireless means (e.g., via a wireless transmitter and a wireless receiver) for sending signals to the components and/or receiving signals from the components for performing one or more of the substrate processing methods of embodiments of the present disclosure.

Those skilled in the art will appreciate that many variations and modifications may be made to the embodiments of the present disclosure without departing from the principles of the present disclosure. Therefore, the disclosed non-limiting example embodiments of the present disclosure are used in a generic and descriptive sense only and not for purposes of limitation.

What is claimed is:

1. A substrate processing method comprising:
supplying a fluid into a process chamber to pressurize the fluid to be in a supercritical phase in the process chamber;
processing a substrate in the process chamber by using the fluid in the supercritical phase; and
reducing a pressure in the process chamber by exhausting the fluid from the process chamber,
wherein the supplying comprises supplying the fluid into the process chamber during a first time period and a second time period, which are continuous with each other,
wherein, during the first time period:
the supplying comprises providing, by a fluid supply unit that includes at least one valve, a first initial supply amount of the fluid toward the process chamber; and
the supplying further comprises discharging, by a venting unit that includes at least one valve, a first discharge amount of the fluid so that a first supply amount of the fluid is supplied into the process chamber, and
wherein, during the second time period:
the supplying comprises providing, by the fluid supply unit, a second initial supply amount of the fluid, different from the first initial supply amount, toward the process chamber; and
the supplying further comprises discharging, by the venting unit, a second discharge amount different from the first discharge amount so that a second supply amount of the fluid, different from the first supply amount, is supplied into the process chamber.

2. The substrate processing method of claim 1, wherein the second initial supply amount is greater than the first initial supply amount.

3. The substrate processing method of claim 2, wherein the second discharge amount is smaller than the first discharge amount.

4. The substrate processing method of claim 3, wherein a slope of pressure rise in the process chamber during the second time period is greater than a slope of pressure rise in the process chamber during the first time period.

5. The substrate processing method of claim 1, wherein the fluid supply unit supplies the fluid at a first speed during the first time period, and supplies the fluid at a second speed greater than the first speed during the second time period.

6. The substrate processing method of claim 1, wherein the supplying further comprises supplying the fluid into the process chamber during a third time period that is after the second time period, and
during the third time period:
the supplying comprises providing, by the fluid supply unit, a third initial supply amount of the fluid, different from the second initial supply amount, toward the process chamber; and
the supplying further comprises discharging, by the venting unit, a third discharge amount of the fluid, different from the second discharge amount, so that a third supply amount of the fluid, different from the second supply amount, is supplied into the process chamber.

7. The substrate processing method of claim 6, wherein the third initial supply amount is greater than the second initial supply amount, and the third discharge amount is smaller than the second discharge amount.

8. The substrate processing method of claim 7, wherein a slope of pressure rise in the process chamber during the third time period is greater than the slope of pressure rise in the process chamber during the second time period.

9. The substrate processing method of claim 1, wherein the fluid supply unit includes:

a storage tank that stores the fluid;

a main supply line connected to the process chamber;

a first supply line and a second supply line, which are disposed in parallel between the storage tank and the main supply line; and the at least one valve of the fluid supply unit, the at least one valve includes a first valve installed in the first supply line, and a second valve installed in the second supply line, wherein the first supply line is used to supply the fluid during the first time period, and the second supply line is used to supply the fluid during the second time period.

10. The substrate processing method of claim 9, wherein the venting unit includes:

a first venting line and a second venting line, which are disposed in parallel with the main supply line; and the at least one valve of the venting unit, the at least one valve of the venting unit includes:

a first venting valve installed in the first venting line; and a second venting valve installed in the second venting line.

11. The substrate processing method of claim 1, wherein a photosensitive film is formed on the substrate, and the fluid includes carbon dioxide, and the method further comprises inserting the substrate into the process chamber while the substrate is wet with a developing solution.

12. A substrate processing apparatus comprising:

a process chamber in which supercritical drying of a substrate is configured to be performed;

a fluid supply unit comprising at least one valve, the fluid supply unit configured to supply a fluid used for the supercritical drying as a part of a pressurizing step;

a venting unit comprising at least one valve, the venting unit configured to adjust a supply amount of the fluid as a part of the pressurizing step;

at least one processor; and a memory storing computer instructions, the computer instructions configured to, when executed by the at least one processor, cause the at least one processor to control the fluid supply unit and the venting unit to perform the pressurizing step, wherein the pressurizing step is performed in a first time period and a second time period, which are continuous with each other, wherein, during the first time period:

the fluid supply unit is controlled by the at least one processor to provide a first initial supply amount of the fluid toward the process chamber; and the venting unit is controlled by the at least one processor to discharge a first discharge amount of the fluid so that a first supply amount of the fluid is supplied into the process chamber, and wherein, during the second time period:

the fluid supply unit is controlled by the at least one processor to provide a second initial supply amount of the fluid, different from the first initial supply amount, toward the process chamber; and the venting unit is controlled by the at least one processor to discharge a second discharge amount of the fluid, different from the first discharge amount, so that a second supply amount of the fluid, different from the first supply amount, is supplied into the process chamber.

13. The substrate processing apparatus of claim 12, wherein the second initial supply amount is greater than the first initial supply amount.

14. The substrate processing apparatus of claim 13, wherein the second discharge amount is smaller than the first discharge amount.

15. The substrate processing apparatus of claim 14, wherein a slope of pressure rise in the process chamber during the second time period is greater than a slope of pressure rise in the process chamber during the first time period.

16. The substrate processing apparatus of claim 12, wherein the computer instructions are configured to, when executed by the at least one processor, cause the at least one processor to control the fluid supply unit to supply the fluid at a first speed during the first time period, and supply the fluid at a second speed greater than the first speed during the second time period.

17. A substrate processing apparatus comprising:

a process chamber in which supercritical drying of a substrate is configured to be performed;

a fluid supply unit configured to supply a fluid used for the supercritical drying as a part of a pressurizing step;

a venting unit configured to adjust a supply amount of the fluid as a part of the pressurizing step;

at least one processor; and a memory storing computer instructions, the computer instructions configured to, when executed by the at least one processor, cause the at least one processor to control the fluid supply unit and the venting unit to perform the pressurizing step, wherein the pressurizing step is performed in a first time period and a second time period, which are continuous with each other, wherein the computer instructions are configured to cause the at least one processor to, during the first time period, control the fluid supply unit and the venting unit such that a first supply amount of the fluid is supplied into the process chamber, wherein the computer instructions are configured to cause the at least one processor to, during the second time period, control the fluid supply unit and the venting unit such that a second supply amount of the fluid, greater than the first supply amount, is supplied into the process chamber, wherein a slope of pressure rise in the process chamber during the second time period is greater than a slope of pressure rise in the process chamber during the first time period, wherein the fluid supply unit comprises:

a storage tank configured to store the fluid;

a main supply line connected to the process chamber; and a first supply line and a second supply line, which are disposed in parallel between the storage tank and the main supply line, and wherein the venting unit comprises:

a first venting line and a second venting line, which are disposed in parallel with the main supply line.

18. The substrate processing apparatus of claim 17, wherein, during the first time period, a first initial supply amount of the fluid is supplied to the main supply line through the first supply line, and a first discharge amount of the fluid is discharged through the first venting line and the second venting line.

19. The substrate processing apparatus of claim 18, wherein the computer instructions are configured to, when executed by the at least one processor, cause the at least one processor to:

control the fluid supply unit, during the second time period, to supply a second initial supply amount of the fluid, greater than the first initial supply amount, to the main supply line through the second supply line; and control the venting unit to discharge a second discharge amount of the fluid through the second venting line, the second discharge amount smaller than the first discharge amount.

20. The substrate processing apparatus of claim 18, wherein the fluid comprises carbon dioxide.

\* \* \* \* \*